United States Patent
Tajima

(10) Patent No.: US 9,299,416 B2
(45) Date of Patent: Mar. 29, 2016

(54) SEMICONDUCTOR DEVICE HAVING A REDUCED FOOTPRINT OF WIRES CONNECTING A DLL CIRCUIT WITH AN INPUT/OUTPUT BUFFER

(71) Applicant: Micron Technology, Inc., Boise, ID (US)

(72) Inventor: Shingo Tajima, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 14/315,033

(22) Filed: Jun. 25, 2014

(65) Prior Publication Data

US 2014/0376325 A1    Dec. 25, 2014

(30) Foreign Application Priority Data

Jun. 25, 2013 (JP) .................. 2013-132800

(51) Int. Cl.
| | |
|---|---|
| G11C 11/4076 | (2006.01) |
| G11C 11/408 | (2006.01) |
| G06F 1/10 | (2006.01) |
| G11C 7/10 | (2006.01) |
| G11C 7/22 | (2006.01) |

(52) U.S. Cl.
CPC .............. *G11C 11/4076* (2013.01); *G06F 1/10* (2013.01); *G11C 7/1072* (2013.01); *G11C 7/22* (2013.01); *G11C 7/222* (2013.01); *G11C 11/408* (2013.01)

(58) Field of Classification Search
CPC .......... G11C 7/10; G11C 7/1072; G11C 7/22; G11C 7/222; G11C 11/4076; G11C 11/408; G06F 1/10; G06F 1/12
See application file for complete search history.

(56) References Cited

U.S. PATENT DOCUMENTS

| | | | | | |
|---|---|---|---|---|---|
| 5,911,063 | A * | 6/1999 | Allen | .......................... | G06F 1/10 713/500 |
| 6,229,861 | B1 * | 5/2001 | Young | ........................ | G06F 1/10 375/356 |
| 6,784,707 | B2 * | 8/2004 | Kim | ....................... | H03L 7/0812 327/142 |
| 6,941,532 | B2 * | 9/2005 | Haritsa | ................ | G06F 17/5022 716/114 |
| 7,042,269 | B2 * | 5/2006 | Kao | ........................... | G06F 1/10 327/295 |
| 7,533,286 | B2 * | 5/2009 | Mosur | ........................ | G06F 1/10 713/600 |
| 2005/0046458 | A1 * | 3/2005 | Schroeder | ................. | G06F 1/10 327/276 |
| 2012/0124409 | A1 | 5/2012 | Miyano | | |
| 2014/0265578 | A1 * | 9/2014 | Engel | ........................ | H02J 4/00 307/42 |

* cited by examiner

*Primary Examiner* — Harry W Byrne
*Assistant Examiner* — Lance Reidlinger
(74) *Attorney, Agent, or Firm* — Dorsey & Whitney LLP

(57) ABSTRACT

An apparatus includes a clock terminal configured to receive an external clock signal, a clock generator configured to generate an internal clock signal in response to the external clock signal, first and second output circuits each coupled to the clock generator, a first clock line coupled between the clock generator and the first output circuit, and the second clock line coupled between the clock generator and the second output circuit. The first clock line represents a first capacitance and a first resistance while the second clock line represents a second capacitance and a second resistance. A first value defined as the product of the first capacitance and the first resistance is substantially equal to a second value defined as the product of the second capacitance and the second resistance.

20 Claims, 12 Drawing Sheets

SEMICONDUCTOR DEVICE HAVING A REDUCED FOOTPRINT OF WIRES CONNECTING A DLL CIRCUIT WITH AN INPUT/OUTPUT BUFFER

This application is based upon and claims the benefit of priority from Japanese patent application No. 2013-132800, filed on Jun. 25, 2013, the disclosure of which is incorporated herein in its entirety by reference.

BACKGROUND

1. Technical Field

Embodiments of the present invention relate to a semiconductor device and, more particularly, to a semiconductor device for generating a clock signal using a delay-locked loop (DLL).

2. Description of Related Art

In recent years, apparatuses which include semiconductor devices employ a growing number of synchronous semiconductor devices, each of which carries out an operation in synchronism with a clock signal, in order to match operation timings between the semiconductor devices mounted thereon. For example, there is, as one of the synchronous semiconductor devices, a double data rate type synchronous dynamic random access memory (DDR-SDRAM) which is one of semiconductor storage devices used as memories of servers, personal computers, or the like.

In the synchronous semiconductor device, a DLL circuit for generating an internal clock signal in synchronism with the external clock signal is used in order to bring an output timing of read data into sync with an external clock signal which is a clock signal of a system. In particular, in the synchronous semiconductor device for simultaneously producing a plurality of pieces of data in parallel, it is necessary to reduce delay time differences between the internal clock signals which are supplied to a plurality of output portions for producing the plurality of pieces of data.

JP-A-2012-104197 (which corresponds to US 2012/0124409 A1 and which will later be called "Patent Literature 1") discloses a clock tree for distributing an internal clock signal generated by a DLL circuit to a plurality of input/output buffers and an output replica. Specifically speaking, the clock tree described in Patent Literature 1 disposes wires for connecting input nodes of the clock tree with the plurality of input/output buffers and the output replica, respectively, so that the respective wires are equal in length. Furthermore, the clock tree is configured to dispose buffers between branch points of the wires, respectively. With the above-mentioned structure in Patent Literature 1, it results in reducing delay differences between a plurality of clock signals supplied to the plurality of input/output buffers and the output replica.

However, the clock tree described in Patent Literature 1 has an increased footprint of the wires for connecting the input nodes of the clock tree with the plurality of input/output buffers and the output replica, respectively. As described above, it is to be wished that the configuration disclosed in Patent Literature 1 is further improved in terms of miniaturization of the semiconductor device.

SUMMARY

According to one embodiment, there is provided an apparatus comprising: a clock terminal receiving an external clock signal; a clock generator coupled to the clock terminal and generating an internal clock signal in response to the external clock signal; first and second output circuits each coupled to the clock generator; a first clock line coupled to the clock generator at one end thereof, coupled to the first output circuit at the other end thereof and conveying the internal clock signal from the clock generator to the first output circuit, the first clock line representing a first capacitance and a first resistance; and a second clock line coupled to the clock generator at one end thereof, coupled to the second output circuit at the other end thereof and conveying the internal clock signal from the clock generator to the second output circuit, the second clock line representing a second capacitance that is different from the first capacitance and a second resistance that is different from the first resistance, and wherein a first value defined as the product of the first capacitance and the first resistance is substantially equal to a second value defined as the product of the second capacitance and the second resistance.

According to another embodiment, there is provided an apparatus comprising: a clock terminal receiving an external clock signal; a clock generator coupled to the clock terminal and generating an internal clock signal in response to the external clock signal; a main clock line coupled to the clock generator at a first portion, the main clock line further includes a second portion and a third portion that is between the first and second portion; first and second output circuits arranged along the main clock line; a first clock line coupled to the third portion of the main clock line at one end thereof and coupled to the first output circuit at the other end thereof; and a second clock line coupled to the second portion of the main clock line at one end thereof and coupled to the second output circuit at the other end thereof, the first clock line is greater in length than the second clock line.

BRIEF DESCRIPTION OF THE DRAWINGS

The above features and advantages of the present invention will be more apparent from the following of certain preferred embodiments taken in conjunction with the accompanying drawings, in which.

DETAILED DESCRIPTION OF THE EMBODIMENTS

Embodiments of the present invention will be explained below in detail with reference to the accompany drawings.

First Exemplary Embodiment

Figure 1:
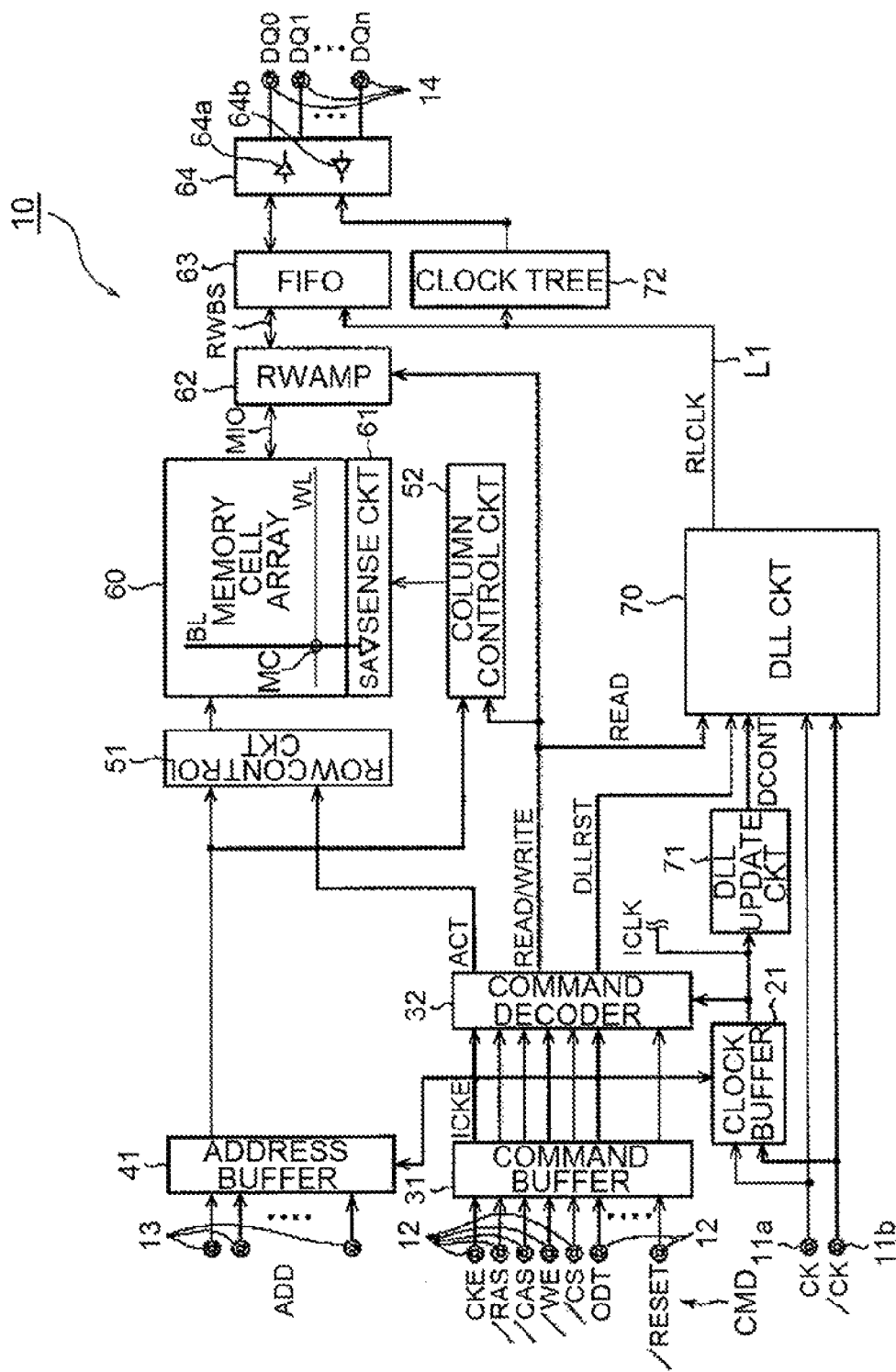
FIG. 1 is a block diagram showing an overall configuration of a semiconductor device according to a first embodiment of the present invention.

Referring now to FIG. 1, an apparatus includes a semiconductor device 10 according to a first embodiment of the present invention. As used herein, apparatus may refer to, for example, an integrated circuit, a memory device, a memory system, an electronic device or system, a smart phone, a tablet, a computer, a server, etc. In other words, FIG. 1 illustrates an overall block diagram of a DRAM (Dynamic Random Access Memory) which is one of semiconductor storage devices.

The illustrated semiconductor device 10 comprises a DDR (Double Data Rate) type SDRAM (Synchronous Dynamic Random Access Memory) which includes, as external terminals, first and second clock terminals 11a, 11b, a plurality of command terminals 12, a plurality of address terminals 13, and a plurality of data input/output terminals 14. Although the semiconductor device 10 includes a power supply terminal, a data strobe terminal, and so on, indication of these is omitted in the drawing.

The first and the second clock terminals 11a and 11b are supplied with first and second external clock signals CK and /CK, respectively. The first and the second external clock signals CK and /CK are supplied to a clock buffer 21 and a DLL (delay locked loop) circuit 70. In this specification, a signal with "/" appended to a first part of a signal name means that it is an inverted signal of a corresponding signal or a low active signal. Accordingly, the first and the second external clock signals CK, /CK are signals that complement each other. The clock buffer 21 generates a single-phase internal clock signal ICLK based on the first and the second external clock signals CK and /CK. The clock buffer 21 supplies the internal clock signal ICLK to a DLL update circuit 71 and other circuits that are not shown.

The DLL circuit 70 comprises a clock generation circuit that receives the first and the second external clock signals CK and /CK and generates an internal clock signal RLCLK that is phase controlled relative to the first and the second external clock signals CK and /CK and duty controlled. The generated internal clock signal RLCLK is supplied to FIFO (first-in first-out) circuits 63 and a clock tree (a clock transmission circuit) 72 through a transmission path L1. Among these, the clock tree 72 comprises a circuit that distributes the supplied internal clock signal RLCLK to an input/output buffer 64. Details of the DLL circuit 70 will be described later.

The DLL update circuit 71 generates a DLL update signal DCONT for every predetermined clock number of the internal clock signal ICLK, and supplies the DLL update signal DCONT to the DLL circuit 70. Accordingly, the DLL update signal DCONT is a periodic signal that is activated at a certain periodic cycle. Details of the DLL update signal DCONT will also be described later.

The command terminals 12 are supplied with various command signals CMD such as a clock enable signal CKE, a row address strobe signal /RAS, a column address strobe signal /CAS, a write enable signal /WE, a chip select signal /CS, an on-die termination signal ODT, a reset signal /RESET, and so on. These command signals CMD are supplied to a command buffer 31. The command buffer 31 reshapes these command signals CMD and supplies them to a command decoder 32. As for the clock enable signal CKE, it is supplied to the clock buffer 21 and an address buffer 41 as an internal clock enable signal ICKE. The clock buffer 21 and the address buffer 41 may operate when the internal clock enable signal ICKE is activated. The dock buffer 21 and the address buffer 41 may not operate when the internal clock enable signal ICKE is deactivated.

The command decoder 32 generates various internal commands by retaining, decoding, counting the command signals CMD, and so on. These internal commands include not only various commands related to reading/writing of memory cells such as an active command ACT, a read command READ, a write command WRITE, etc., but also a DLL reset command DLLRST that is generated in response to the reset signal /RESET being inputted. Among the generated internal commands, the active command ACT is supplied to a row control circuit 51, the read command READ and the write command WRITE are supplied to a column control circuit 52 and a read/write amplifier (RWAMP) 62, and the DLL reset command DLLRST is supplied to the DLL circuit 70. The read command READ includes a one-shot type signal that is temporarily activated upon a start of a read operation, and a relatively long-lived signal that is activated continuously during the read operation; and the latter is supplied also to the DLL circuit 70.

The address terminals 13 receive an address signal ADD. The address signal ADD supplied thereto is transferred to the address buffer 41. The address buffer 41 latches the address signal ADD supplied thereto. Further, when the address signal indicates a row address, the row address is supplied to the row control circuit 51. On the other hand, when the address signal indicates a column address, the column address is supplied to the column control circuit 52. In addition, in a case where entry is made in a mode register set, the address signal ADD is supplied to a mode register (not shown), and thereby contents of the mode register is updated.

The row control circuit 51 selects one of word lines WL included in a memory cell array 60 based on the row address supplied from the address buffer 41. In the memory cell array 60, a plurality of word lines WL and a plurality of bit lines BL intersect one another, and memory cells MC are arranged at intersections thereof (in FIG. 1, one word line WL, one bit line BL, and one memory cell MC are shown). The bit lines BL are connected to corresponding sense amplifiers SA in a sense circuit 61.

The column control circuit 52 selects one of the sense amplifiers SA included in the sense circuit 61. Selected by the column control circuit 52, the sense amplifier SA is connected to the read/write amplifier 62 via a main I/O line MIO.

In a read operation, a plurality of read data DQ amplified by the sense amplifiers SA are further amplified in the read/write amplifiers 62, and are outputted outside from the data input/output terminals 14 via the FIFO circuits 63 and the input/output buffer 64. On the other hand, in a write operation, a plurality of write data DQ inputted from outside through the data input/output terminals 14 are inputted to the read/write amplifiers 62 via the FIFO circuits 63 and the input/output buffer 64, and are supplied to the sense amplifiers SA.

The data input/output terminals 14 are terminals for outputting the plurality of read data DQ and for inputting the plurality of write data DQ. In the semiconductor device 10, (n+1) pieces (n≥0) of the data input/output terminals 14 are provided, and (n+1) bits of data may be input or output simultaneously. In many case, n is equal to seven or fifteen, and in the present specification, the explanation will be continued under a premise that n=15.

The FIFO circuits 63 are first-in first-out circuits that queue the plurality of read data DQ or the plurality of write data DQ, and are provided for the data input/output terminals 14, respectively. In explaining by focusing on the read operation, the plurality of read data outputted from the read/write amplifiers 62 are distributed to the data input/output terminals 14, respectively, by a multiplexer (not shown), and are queued to the corresponding FIFO circuits 63. The FIFO circuits 63 output the plurality of queued data to the input/output buffer 64 at the timing in synchronism with the internal clock signal RLCLK.

The input/output buffer 64 comprises output buffers 64a and input buffers 64b each of which are provided for the data input/output terminals 14, respectively. Focusing on the read operation, it is explained that the output buffers 64a reshape the plurality of read data outputted from their corresponding FIFO circuits 63, and output the plurality of data to outside from their corresponding data input/output terminals 14 at the timing in synchronism with the internal clock signal RLCLK.

The foregoing is the description of the overall configuration of the semiconductor device 10 of a first embodiment of the present invention. Next, the DLL circuit 70 and other configurations relevant thereto will be explained in detail.

Figure 2:
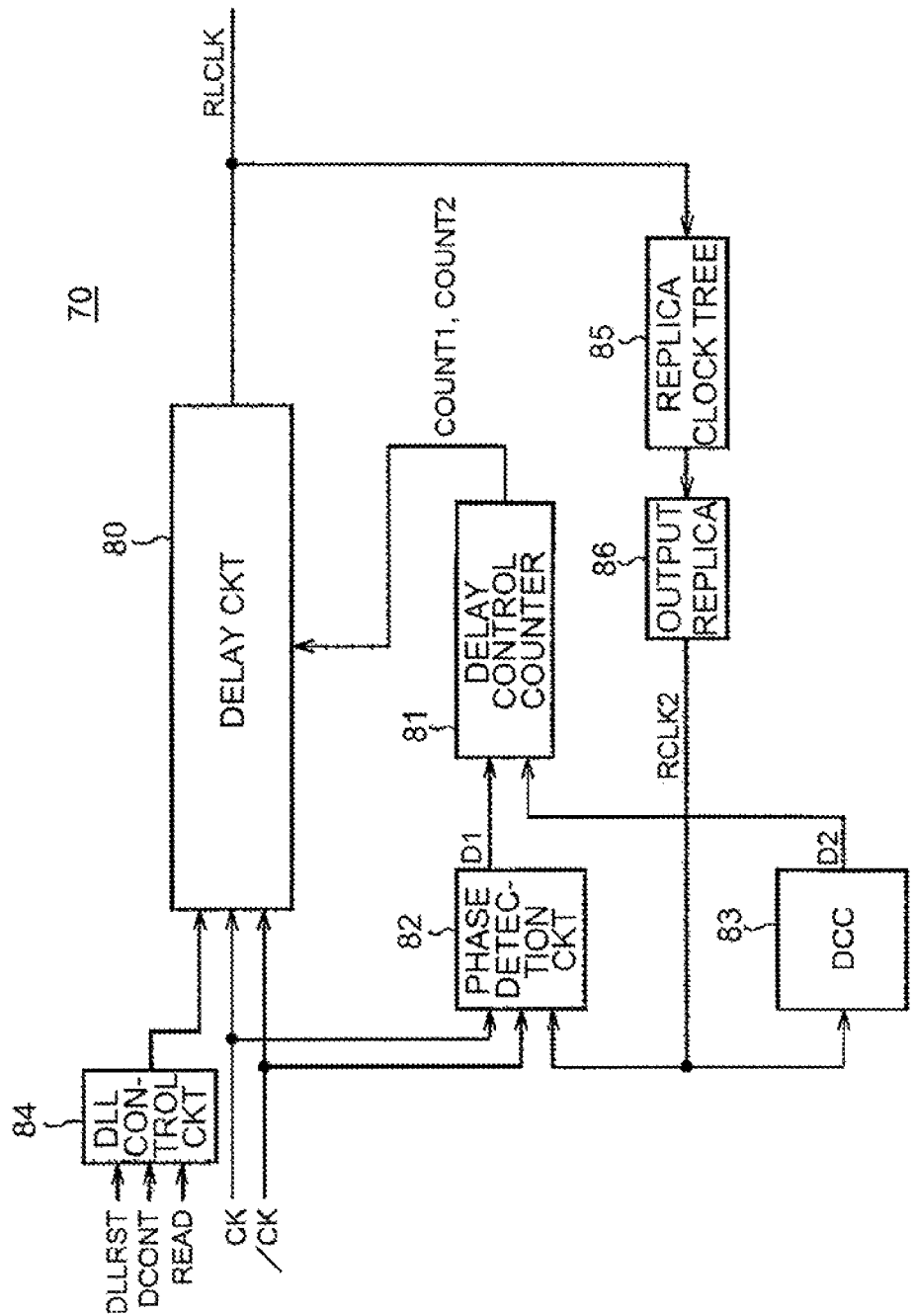
FIG. 2 is a block diagram showing a circuit configuration of the DLL circuit shown in FIG. 1.

FIG. 2 is a block diagram showing a circuit configuration of the DLL circuit 70 according to a first embodiment of the present invention. As illustrated in FIG. 2, the DLL circuit 70 according to a first embodiment of the present invention includes a delay circuit 80, a delay control counter 81, a phase detection circuit 82, a duty ratio detection circuit (DCC (Duty Correction Circuit)) 83, a DLL control circuit 84, a replica clock tree 85, and an output replica (replica circuit) 86.

The replica clock tree 85 is a replica for the transmission path L1 and the dock tree 72 illustrated in FIG. 1. The output replica 86 is a replica for the output buffers 64a. The replica clock tree 85 and the output replica 86 configure a replica circuit (a second replica circuit) for a transmission path of the internal clock signal RLCLK that goes from the DLL circuit 70 to one of the plurality of data input/output terminals 14. A combination of the replica clock tree 85 and the output replica 86 picks up the internal clock signal RLCLK in proximity to an output terminal of the delay circuit 80 and generates a feedback clock signal RCLK2 in synchronism with the internal clock signal RLCLK.

In this connection, a replica refers to a circuit having a signal line load substantially equal to that of a target circuit. The signal line load is a load imposed on a signal passing through a signal line, and is determined by the number of buffers (transistors) to be provided in the signal line, profile of each transistor, a length and width of the signal line, and so on. In a case where an identical clock signal is inputted to two circuits having substantially equal signal line loads, a difference in delay amounts of the clock signals outputted respectively becomes small enough to ignore from a viewpoint of a required accuracy of the DLL circuit 70.

The delay circuit 80 is configured of delay lines that generate the single phase internal clock signal RLCLK by delaying the first and the second external clock signals CK, /CK. The delay circuit 80 has a delay amount which is adjusted by the delay control counter 81. Although not specifically limited, the delay circuit 80 may include coarse delay lines that delay the first and the second external clock signals CK, /CK ad a relatively cause adjustment pitch, and fine delay lines that delay the first and the second external clock signals CK, /CK at a relatively fine adjustment pitch.

The phase detection circuit 82 comprises a circuit that receives the first and the second external clock signals CK, /CK and the feedback dock signal RCLK2, detects phase difference therebetween, and determines whether the phase of the feedback clock signal RCLK2 is leading or lagging relative to the first and the second external clock signals CK, /CK. A determination result in the phase detection circuit 82 is supplied to the delay control counter 81 as a first determination result signal D1.

Responsive to the feedback clock signal RCLK2, the DCC 83 detects a duty ratio thereof and determines whether the detected duty ratio is larger or smaller than a predetermined value (e.g. 50%). A determination result in the DCC 83 is supplied to the delay control counter 81 as a second determination result signal D2.

The delay control counter 81 comprises a circuit that controls the delay amount in the delay circuit 80 based on the first and the second determination result signals D1, D2. Specifically, the delay control circuit 81 includes first and second counters (not shown). The first counter counts up and counts down based on the first determination result signal D1. The second counter counts up and counts down based on the second determination result signal D2. Notably, the counting-up and the counting-down in the delay control counter 81 may be performed in synchronism with the first and the second external clock signals CK, /CK, or may be performed, by generating a divided clock signal of the first and the second external clock signals CK, /CK, in synchronism with the divided clock signal.

A first count value COUNT1 of the first counter and a second count value COUNT2 of the second counter are respectively supplied to the delay circuit 80. The delay circuit 80 delays the first and the second external clock signals CK, /CK by the delay amounts based on the first and the second count values COUNT 1, COUNT2. Specifically, the delay circuit 80 selects a delay amount of a rising edge of the internal clock signal RLCLK based on the first count value COUNT1, and selects a delay amount of a falling edge of the internal clock signal RLCLK based on the second count value COUNT2. By the former, the rising edge of the read data synchronizes with the first and the second external clock signals CK, /CK, and by latter, the duty ratio of the read data comes to be at the aforementioned predetermined value.

Responsive to the aforementioned DLL reset command DLLRST, the DLL update signal DCONT, and the read command READ, the DLL control circuit 84 operates the delay circuit 80 based thereon.

Figure 3:
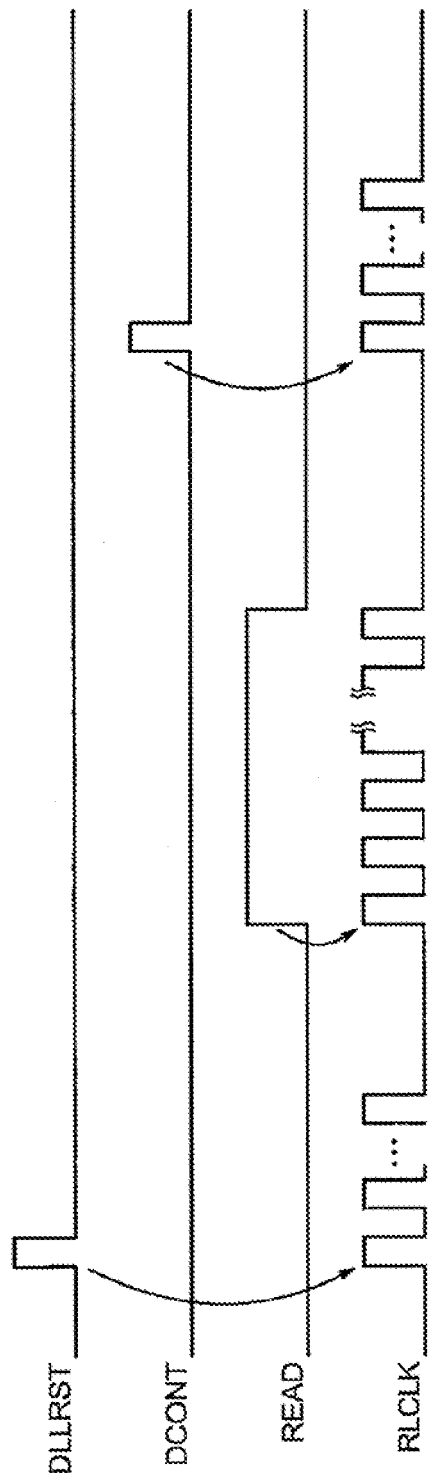
FIG. 3 is a timing chart describing an operation of the semiconductor device illustrated in FIG. 1.

FIG. 3 is a timing chart of the DLL reset command DLLRST, the DLL update signal DCONT, the read command READ, and the internal clock signal RLCLK. As shown in the drawing, each of the DLL rest command DLLRST and the DLL update signal DCONT is a one-shot signal that is activated temporarily for a certain period of time. When the DLL reset command DLLRST and the DLL update signal DCONT are activated, the DLL control circuit 84 keeps the delay circuit 80 operated. The operation of the DLL circuit 70 based on the DLL reset command DLLRST and the DLL update signal DCONT as such is performed so that the phase and the duty ratio of the internal clock signal RLCLK do not deviate significantly from their desired values.

On the other hand, the read command READ is continuously activated during the read operation as aforementioned. The DLL control circuit 84 operates the delay circuit 80 during when the read command READ is being activated.

Figure 4:
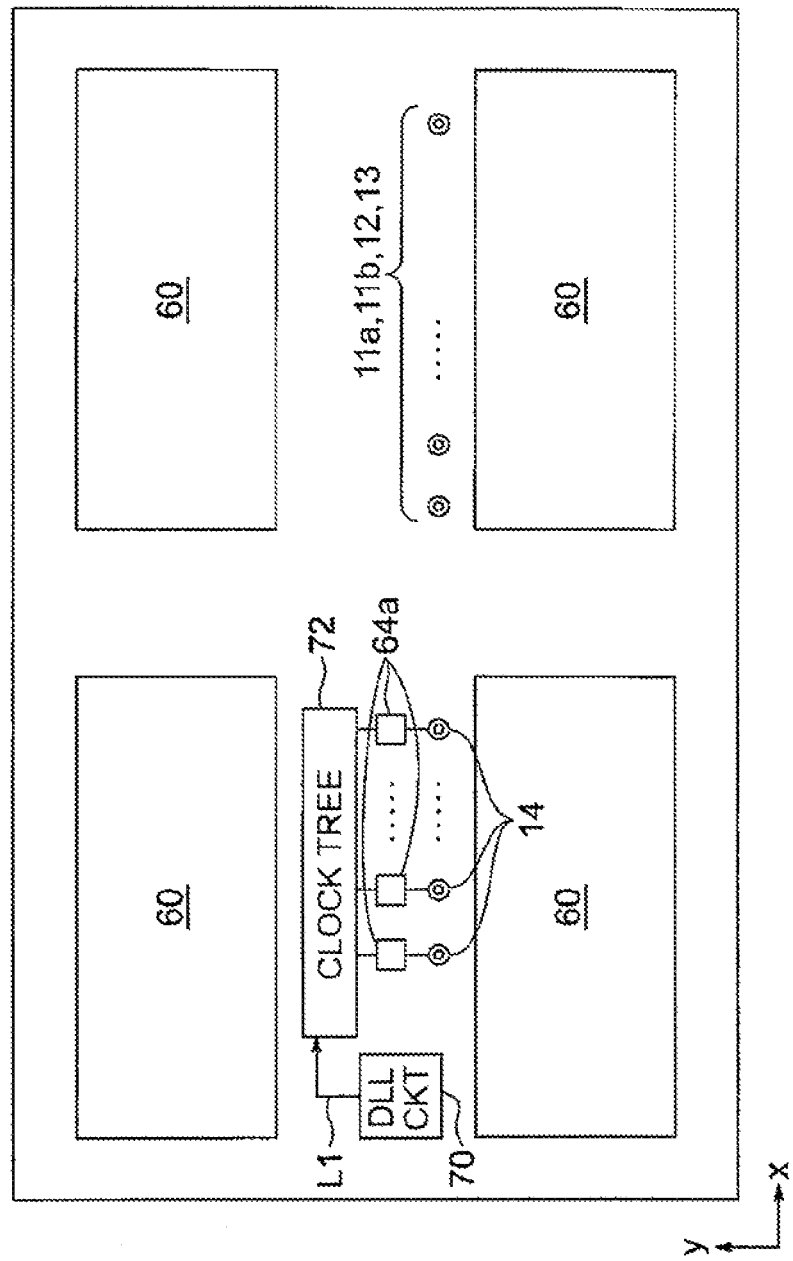
FIG. 4 is a plan view of the semiconductor device according to the first embodiment of the present invention.

FIG. 4 is a plan view of the semiconductor device 10. As shown in FIG. 4, in the semiconductor device 10, four memory cell arrays 60 are arranged in a matrix fashion. The first and the second clock terminals 11a, 11b, the command terminals 12, and the address terminals 13, and the data input/output terminals 14 are arranged in a line in a region between the two memory cell arrays 60 aligning in a y-direction shown in the drawing.

The output buffers 64a are arranged aligning in an x-direction as shown in FIG. 4. Of the both ends in the x-direction, the DLL circuit 70 is arranged on an opposite side from the output buffers 64a. The output buffers 64a are also called output circuits.

Figure 5:
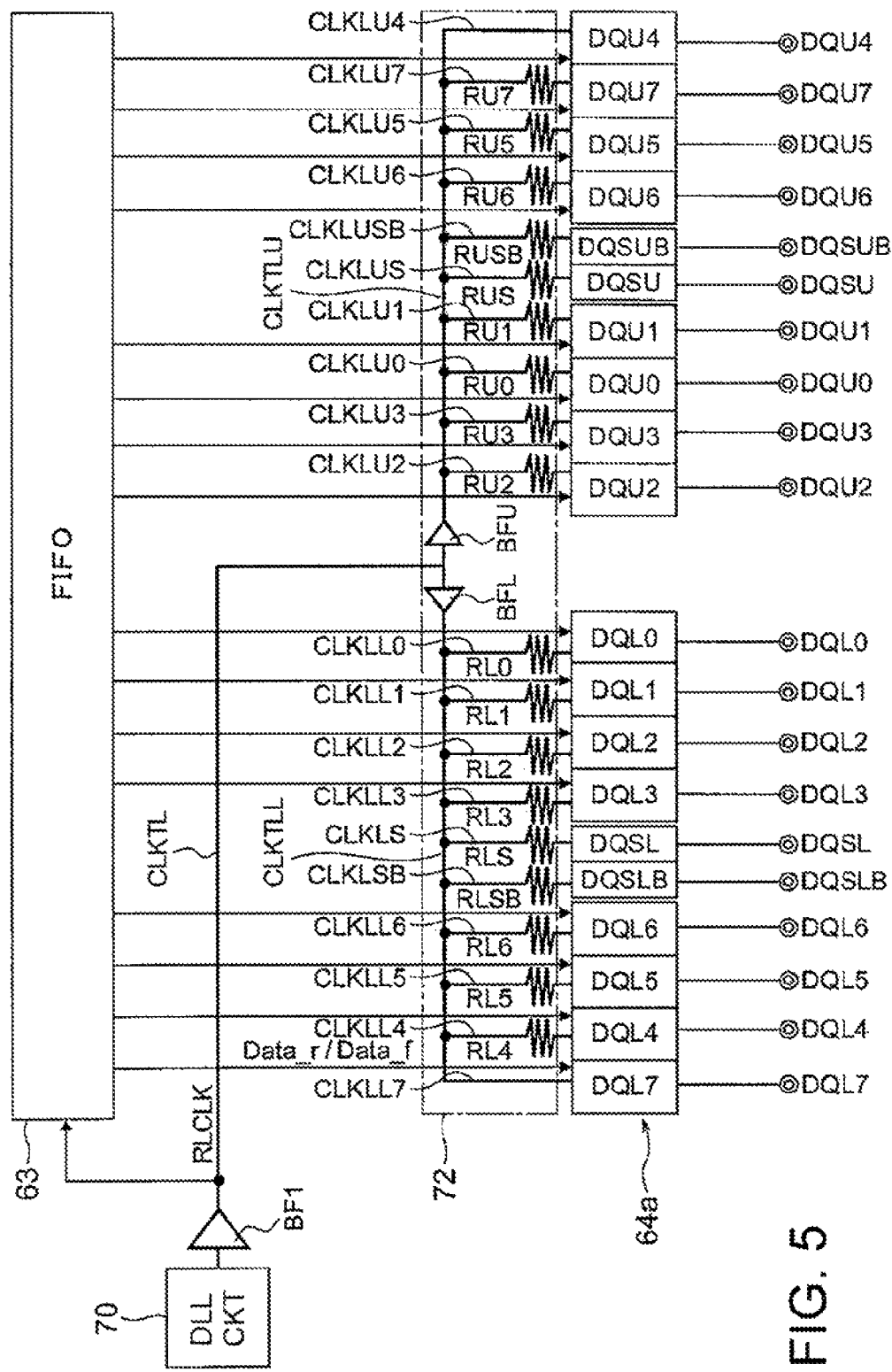
FIG. 5 is a circuit diagram showing a circuitry configuration of the clock tree shown in FIG. 4.

FIG. 5 is a circuit diagram showing a circuitry configuration of the clock tree 72.

Inasmuch as the semiconductor device 10 according to a first embodiment of the present invention is an X16 output/input configuration, the semiconductor device 10 includes, as the data output portions, first through eighth lower side data output portions DQL0 to DQL7 of 8 bits in length and first through eighth upper side data output portions DQU0 to DQU7 of 8 bits in length. In addition, similarly, the semiconductor device 10 includes, as the data strobe signal output portions, first and second lower side data strobe output portions DQSL, DQSLB, and first and second upper side data strobe output portions DQSU, DQSUB. Herein, the first and the second lower side data strobe output portions DQSL, DQSLB are circuits for outputting first and second lower side data strobe signals that are complemented to each other, respectively. Likewise, the first and the second upper side data strobe output portions DQSU, DQSUB are circuits for outputting first and second upper side data strobe signals that are complemented to each other, respectively. The data output portions and the data strobe output portions may be merely called output circuits, respectively.

The output circuits 64a are connected to the corresponding external terminals, respectively.

The data output portions are supplied with a corresponding plurality of read data Data_r, Data_f from the FIFO circuits 63, respectively. Herein, the plurality of read data Data_r are a plurality of data outputted to outside in synchronism with a rising edge of an output clock signal while the plurality of read data Data_f are a plurality of data outputted to outside in synchronism with a falling edge of the output clock signal.

The data strobe output portions are supplied with a power supply voltage (not shown) and a ground voltage (not shown) in place of the plurality of read data Data_r, Data_f.

The output portions 64a are supplied with the internal clock signal RLCLK in addition to the plurality of read data (the power supply voltage and the ground voltage in the data strobe output portions). Now, a concrete configuration will be described using the lower side output portion as an example.

Supplied from the DLL circuit 70, the internal clock signal RLCLK is transferred in turn to a buffer circuit BF1, a clock trunk line CLKTL, a lower side buffer circuit BFL, and a lower side clock trunk line CLKTLL. Furthermore, supplied from the lower side clock trunk line CLKTLL to the respective output portions, the internal clock signal RLCLK is supplied via corresponding ten lower side clock lines CLKLL0 to CLKLL7, CLKLSB, and CLKLS as ten internal clock signals RLCLK_L0 to RLCLK_L7, RLCLK_LSB, and RLCLK_LS, respectively.

One of features in a first embodiment of the present invention is a portion of the ten lower side clock lines CLKLL0 to CLKLL7, CLKLSB, and CLKLS for connecting the lower side clock trunk line CLKTLL with the output circuits, respectively. More specifically, the one of features of a first embodiment of the present invention is a respect where nine resistor elements RL0 to RL6, RLSB, and RLS are inserted in nine lower side clock wires CLKLL0 to CLKLL6, CLKLSB, and CLKLS for connecting between the lower side clock trunk line CLKLL with nine output circuits DQL0 to DQL6, DQSLB, and DQSL, respectively, except the output circuit DQL7 which is laid at the farthest distance from the lower side buffer circuit BFL. Herein, the nine resistor elements RL0 to RL6, RLSB, and RLS are formed as high resistance wiring layers such as tungsten wiring layers in the manner which will later be described.

The nine resistor elements RL0 to RL6, RLSB, and RLS have resistance values which are different from one another. More specifically, it is assumed that a delay time interval of the internal clock signal RLCLK_L7 in the output circuit DQL7, at which a delay of the internal clock signal RLCLK outputted from the lower side buffer circuit BFL becomes maximum, is a reference delay time interval, the respective resistance values of the nine resistor elements RL0 to RL6, RLSB, and RLS are set so that delay time intervals of nine internal clock signals RLCLK_L0 to RLCLK_L7, RLCLK_LSB, and RLCLK_LS supplied to the respective output circuits are substantially equal to one another. In order to determine such resistance values, the resistance values may be set by calculating CR time constants of paths (the lower side clock lines CLKLL0 to CLKLL7, CLKLSB, and CLKLS corresponding to a part of the lower side clock trunk line CLKTLL) for connecting an output terminal of the lower side buffer circuit BFL with the respective output portions and by causing values of these CR time constants to be substantially equal to a CR time constant of a path for connecting the output terminal of the lower side buffer circuit BFL with the output circuit DQL7.

Herein, the DLL circuit 70 is also called an internal clock generation circuit, and a combination of the clock trunk line CLKTL, the lower side buffer circuit BFL, and the lower side clock trunk line CLKTLL is also called a clock trunk line (CLKTL. BFL, CLKTLL). In addition, the lower side clock line CLKLL0 is also called, for example, a first clock line while the lower side clock line CLKLL1 is also called, for example, a second clock line. In this event, the resistor element RL0 is also called a first resistor element, the resistor element RL1 is also called a second resistor element, the lower side data output portion DQL0 is also called a first output circuit, and the lower side data output portion DQL1 is also called a second output circuit.

In that way, the semiconductor device (10) according to a first embodiment of the present invention comprises the internal clock generation circuit (70), the buffer circuit (BF1) having an input terminal connected to the internal clock generation circuit (70), the first and the second output circuits (DQL0, DQL1), the clock trunk line (CLKTL, BFL, CLK-TLL) having an end connected to an output node of the buffer circuit (BF1), the first clock wire (CLKLL0) connecting the clock trunk line (CLKTL, BFL, CLKTLL) with the first output circuit (DQL0), and the second clock wire (CLKLL1) connecting the clock trunk line (CLKTL, BFL, CLKTLL) with the second output circuit (DQL1), wherein the first clock wire (CLKLL0) includes the first resistor element (RL0) having the first resistance value, the second clock wire (CLKLL1) includes the second resistor element (RL1) having the second resistance value, the first resistance value and the second resistance value are different from each other.

This is one example, therefore, of course, other combinations may be.

Put another way, a combination of the DLL circuit 70, the buffer circuit BF1, the clock trunk line CLKTL and the lower side buffer circuit BFL is called the clock generator. A combination of a part of the lower side clock trunk line (CLKTLL) and the first clock line (CLKLL0) is also called a first clock line coupled to the clock generator at one end thereof, coupled to the first output circuit (DQL0) at the other end thereof and conveying the internal clock signal (RLCLK) from the clock generator to the first output circuit (DQL0). The first clock line represents a first capacitance and a first resistance. A combination of a part of the lower side clock trunk line (CLKTLL) and the second clock line (CLKLL1) is also called a second clock line coupled to the clock generator at one end thereof, coupled to the second output circuit (DQL1) and conveying the internal clock signal (RLCLK) from the clock generator to the second output circuit (DQL1). The second clock line represents a second capacitance that is different from the first capacitance and a second resistance that is different from the first resistance. A first value defined as the product of the first capacitance and the first resistance is substantially equal to a second value defined as the product of the second capacitance and the second resistance.

In other words, the clock trunk line (CLKTL, BFL, CLK-TLL) is also called a main clock line coupled to the clock generation circuit (70) at a first portion (CLKTL). The main clock line (CLKTL, BFL, CLKTLL) further includes a second portion and a third portion that is between the first and second portions. The first and second output circuits (DQL0, DQL1) are arranged along the main clock line (CLKTL, BFL, CLKTLL). The first clock line (CLKLL0) is also called a first clock line while the second clock line (CLKLL1) is also called a second clock line. The first clock line (CLKLL0) is coupled to the third portion of the main clock line (CLKTL, BFL, CLKTLL) at one end thereof and is coupled to the first output circuit (DQL0) at the other end thereof. The second clock line (CLKLL1) is coupled to the second portion of the main clock line (CLKTL, BFL, CLKTLL) at one end thereof and is coupled to the second output circuit (DQL1) at the other end thereof. The first clock line (CLKLL0) is greater than the second clock line (CLKLL1).

Next, a concrete configuration will be described using the upper side output portion as an example.

Supplied from the DLL circuit 70, the internal clock signal RLCLK is transferred in turn to the buffer circuit BF1, the clock trunk line CLKTL, an upper side buffer circuit BFU, and an upper side clock trunk line CLKTLU. Furthermore, supplied from the upper side clock trunk line CLKTLU to the respective output portions, the internal clock signal RLCLK is supplied via corresponding ten upper side clock lines CLKLU0 to CLKLU7, CLKUSB, and CLKUS as ten internal clock signals RLCLK_U0 to RLCLK_U7, RLCLK_USB, and RLCLK_US, respectively.

One of features in a first embodiment of the present invention is a portion of the ten upper side clock lines CLKLU0 to CLKLU7, CLKLUSB, and CLKLUS for connecting the upper side clock trunk line CLKTLU with the output portions, respectively. More specifically, the one of features of a first embodiment is a respect where nine resistor elements RU0 to RU6, RUSB, and RUS are inserted in nine upper side clock wires CLKLU0 to CLKLU6, CLKLUSB, and CLKLUS for connecting between the upper side clock trunk line CLKTLU with nine output portions DQU0 to DQU3, DQU5 to DQU7, DQSUB, and DQSU, respectively, except the output portion DQU4 which is laid at the farthest distance from the upper side buffer circuit BFU. Herein, the nine resistor elements RU0 to RU3, RU5 to RU7, RUSB, and RUS are formed as high resistance wiring layers such as tungsten wiring layers in the manner which will later be described.

The nine resistor elements RU0 to RU3, RU5 to RU7, RUSB, and RUS have resistance values which are different from one another. More specifically, it is assumed that a delay time interval of the internal clock signal RLCLK_U4 in the output portion DQU4, at which a delay of the internal clock signal RLCLK outputted from the upper side buffer circuit BFU becomes maximum, is a reference delay time interval. Under the circumstances, the respective resistance values of the nine resistor elements RU0 to RU3, RU5 to RU7, RUSB, and RUS are set so that delay time intervals of nine internal clock signals RLCLK_U0 to RLCLK_U3, RLCLK_U5 to RLCLK_U7, RLCLK_USB, and RLCLK_US supplied to the respective output portions are substantially equal to one another. In order to determine such resistance values, the resistance values may be set by calculating CR time constants of paths (the upper side clock wires CLKLU0 to CLKLU3, CLKLU5 to CLKLU7, CLKLUSB, and CLKLUS corresponding to a part of the upper side clock trunk wire CLK-TLU) for connecting an output terminal of the upper side buffer circuit BFU with the respective output portions and by causing values of these CR time constants to be substantially equal to a CR time constant of a path for connecting the output terminal of the upper side buffer circuit BFU with the output portion DQU4.

Herein, the DLL circuit 70 is also called the internal clock generating circuit, and a combination of the clock trunk line CLKTL, the upper side buffer circuit BFU, and the upper side clock trunk line CLKTLU is also called a clock trunk line (CLKTL, BFU, CLKTLU). In addition, the upper side clock line CLKLU2 is also called, for example, a first clock line while the upper side clock line CLKLU3 is also called, for example, a second clock line. In this event, the resistor element RL2 is also called a first resistor element, the resistor element RU3 is also called a second resistor element, the upper side data output portion DQU2 is also called a first output circuit, and the upper side data output portion DQU3 is also called a second output circuit.

In that way, the semiconductor device (10) according to a first embodiment of the present invention comprises the internal clock generating circuit (70), the buffer circuit (BF1) having an input terminal connected to the internal clock generating circuit (70), the first and the second output circuits (DQU2, DQU3), the clock trunk line (CLKTL, BFU, CLK-TLU) having an end connected to an output node of the buffer circuit (BF1), the first clock wire (CLKLU2) connecting the clock trunk line (CLKTL, BFU, CLKTLU) with the first output circuit (DQU2), and the second clock wire (CLKLU3) connecting the clock trunk line (CLKTL, BFU, CLKTLU) with the second output circuit (DQU3), wherein the first clock wire (CLKLU2) includes the first resistor element (RU2) having the first resistance value, the second dock wire (CLKLU3) includes the second resistor element (RU3) having the second resistance value, the first resistance value and the second resistance value are different from each other.

This is one example, therefore, of course, other combinations may be.

With this structure, it is possible for a first embodiment of the present invention to cause the plurality of paths going from the output terminal of the DLL circuit 70 to the plurality of output portions 64a to be different in lengths from one another and to reduce the wiring area of the clock trunk line and the clock lines in composition with that of the related configuration. Furthermore, it is possible to shorten an absolute delay time interval of the internal clock signal in compassion with that of the related art because the resistor element has the delay time interval shorter than that of the buffer circuit.

A layout of the lines of a part of the clock tree will be shown in FIG. 8 which will later be described.

Figure 6:
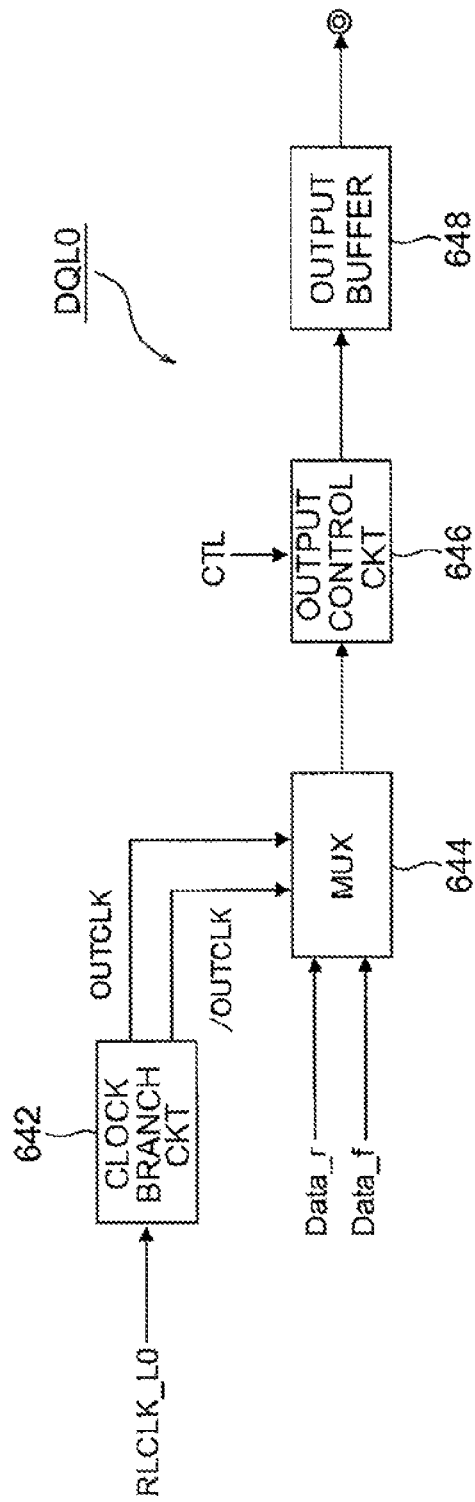
FIG. 6 is a block diagram showing a configuration of the output portion shown in FIG. 5.

FIG. 6 is a block diagram showing a configuration of the output portion 64a. In FIG. 6, the output circuit DQL0 of FIG. 5 will be explained as an example.

The output circuit DQL0 comprises a clock branch circuit 642, a multiplexer circuit (MUX) 644, an output control circuit 646, and an output buffer 648.

The clock branch circuit 642 comprises a circuit for generating first and second output clock signals OUTCLK, /OUTCLK in accordance with the internal clock signal RLCLK_L0 supplied from the clock tree 72. Herein, the first and the second output clock signals OUTCLK, /OUTCLK are clock signals having opposite phases to each other, namely, complementary phases to each other.

The multiplexer circuit (MUX) 644 produces the read data Data_r supplied from the FIFO circuits 63 in synchronism with the raising edge of the first output clock signal OUTPUT and produces the read data Data_f in synchronism with the raising edge of the second output clock signal /OUTCLK (i.e. the falling edge of the first output clock signal OUTCLK). That is, the multiplexer circuit (MUX) 644 serves as a parallel/serial converting circuit for converting parallel data supplied from the FIFO circuits 63 to serial data.

The output control circuit 646 comprises a circuit for controlling operation of the output buffer 648 in accordance with the read data Data_r, Data_f supplied from the multiplexer circuit (MUX) 644 and a plurality of control signals CTL. By way of example, the control signals CTL comprises an on die termination signal indicative of an ODT (On Die Termination) operation of the output buffer 648, a driver strength signal indicative of a drive capacity of the output buffer 648, a ZQ signal indicative of an impedance of the output buffer 648, and so on. These control signal CTL are supplied from the mode register (not shown), the command decoder 32, a calibration circuit (not shown), and so on.

Figure 7:
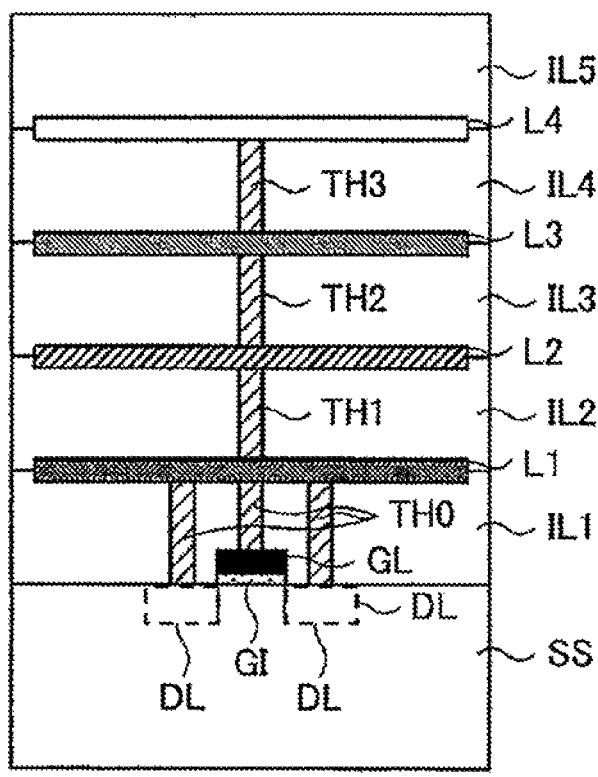
FIG. 7 is a schematic diagram of a multi-level wiring structure.

FIG. 7 is a schematic diagram of a multi-level wiring structure.

The illustrated multi-level wiring structure comprises structure in which diffusion layers DL and a gate wiring layer GL are formed on a surface of a semiconductor substrate SS, and a first wiring layer L1, a second wiring layer L2, a third wiring layer L3, and a fourth wiring layer L4 are stacked above the semiconductor substrate SS in the order dosing to the surface of the semiconductor substrate SS. The first wiring layer L1 comprises, for example, a wiring layer containing tungsten. Each of the second through the fourth wiring layers L2 to L4 comprises, for example, a wiring layer containing at least one of aluminum and copper. The respective wiring layers are mutually insulated by first through fourth interlayer insulating layers IL1, IL2, IL3, and IL4. In addition, the fourth wiring layer L4 of the top layer has an upper surface which is covered with a protection interlayer insulating layer IL5.

A thin gate insulating film GI is formed between the gate wiring layer GL and the surface of the semiconductor substrate SS. The diffusion layers DL and the gate wiring layer GL, and the first wiring layer L1 are mutually connected at necessary positions by zeroth through hole electrodes TH0 penetrating the first interlayer insulating layer IL1. Likewise, the first wiring layer L1 and the second wiring layer L2 are mutually connected to each other at a necessary position by a first through hole electrode TH1 penetrating the second interlayer insulating layer IL2. In addition, the second wiring layer L2 and the third wiring layer L3 are mutually connected to each other at a necessary position by a second through hole electrode TH2 penetrating the third interlayer insulating layer IL3. Furthermore, the third wiring layer L3 and the fourth wiring layer L4 are mutually connected to each other at a necessary position by a third through hole electrode TH3 penetrating the fourth interlayer insulating layer IL4.

Figure 8:
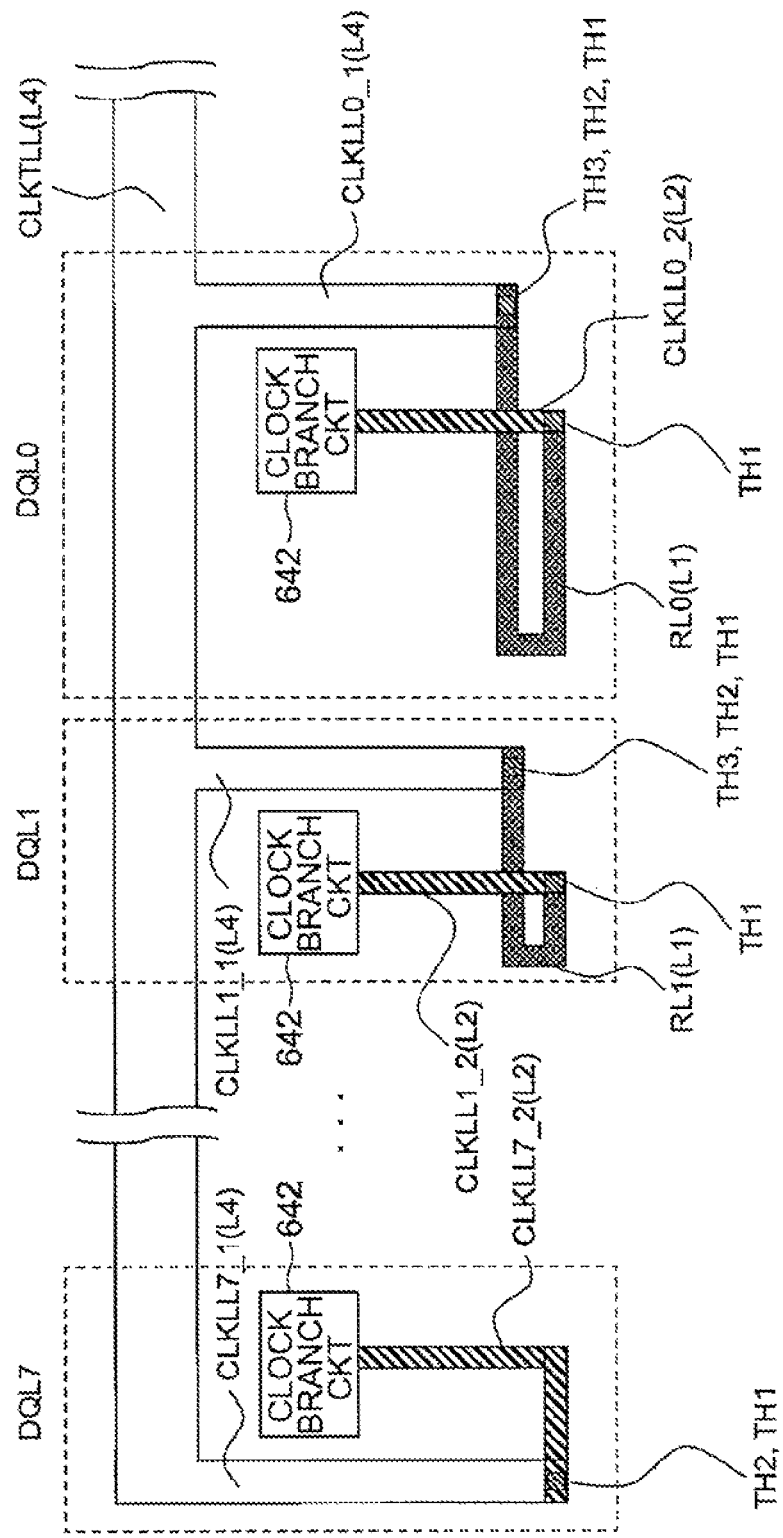
FIG. 8 is a schematic diagram showing a layout of the clock tree according to the first embodiment of the present invention.

FIG. 8 is a schematic diagram showing a layout of the clock tree 72. FIG. 8 illustrates a wiring layout of the lower side clock trunk line CLKTLL, and the first, second, and eighth lower side clock lines CLKLL0, CLKLL1, and CLKLL7 in FIG. 5.

The first lower side clock lines CLKLL0 includes the first resistor element RL0, a first line portion CLKLL0_1 that connects an end of the first resistor element RL0 with the lower side clock trunk line CLKTLL, and a second line portion CLKLL0_2 that connects another end of the first resistor element RL0 with the clock branch circuit 642 in the output circuit. The lower side clock trunk line CLKTLL and the first line portion CLKLL0_1 are formed as the fourth wiring layer L4 in FIG. 7, the first resistor element RL0 is formed as the first wiring layer L1 in FIG. 7, and the second line portion CLKLL0_2 is formed as the second wiring layer L2 in FIG. 7.

The second lower side clock line CLKLL1 is substantially similar in structure to the first lower side clock wire CLKLL0 except that the resistance value of the second resistor element RL1 is different from the resistance value (herein, a length) of the first resistor element RL0.

More specifically, the second lower side clock line CLKLL1 includes the second resistor element RL1, a third line portion CLKLL1_1 that connects an end of the second resistor element RL1 with the lower side clock trunk line CLKTLL, and a fourth line portion CLKLL1_2 that connects another end of the second resistor element RL1 with the clock branch circuit 642 in the output portion. The lower side clock trunk line CLKTLL and the third line portion CLKLL1_1 are formed as the fourth wiring layer L4 in FIG. 7, the second resistor element RL1 is formed as the first wiring layer L1 in FIG. 7, and the fourth line portion CLKLL1_2 is formed as the second wiring layer L2 in FIG. 7.

In this connection, the lower side clock trunk line CLKTLL is also called a clock trunk line and the fourth wiring layer L4 is also called a third wiring layer. In addition, the first lower side clock line CLKLL0 is also, for example, called a first clock line while the second lower side clock line CLKLL1 is also, for example, called a second clock line.

That is, the semiconductor device (10) according to a first embodiment further comprises the multi-level wiring structure including the first wiring layer (L1), the second wiring layer (L2) formed above the first wiring layer (L1), and the third wiring layer (L4) formed above the second wiring layer (L2), wherein the first clock line (CLKLL0) includes the first line portion (CLKLL0_1) that connects the clock truck line (CLKTLL) with an end of the first resistor element (RL0) and the second line portion (CLKLL0_2) that connects another end of the first resistor element (RL0) with the first out portion, wherein the second clock line (CLKLL1) includes the third wire portion (CLKLL1_1) that connects the clock trunk line (CLKTLL) with an end of the second resistor element (RL1) and the fourth line portion (CLKLL1_2) that connects another end of the second resistor element (RL1) with the second output portion, wherein the clock trunk line (CLKTLL), the first line portion (CLKLL0_1), and the third line portion (CLKLL1_1) are formed as the third wiring layer (L4), the second line portion (CLKLL0_2) and the fourth line portion (CLKLL1_2) are formed as the second wiring layer (L2), and the first resistor element (RL0) and the second resistor element (RL1) are formed as the first wiring layer (L1).

This is one example, therefore, of course, other combinations may be.

Furthermore, the first lower side clock line CLKLL0 is also, for example, called a first clock transmission path while the second lower side clock line CLKLL1 is also, for example, called a second clock transmission path. In this event, the first resistor element RL0 serves as a first delay part while the second resistor element RL1 serves as a second delay part.

In the manner as described above, the semiconductor device (10) according to a first embodiment of the present invention comprises: the internal clock generating circuit (70) that generates the internal clock signal (RLCLK); the first and the second output circuits (DQL0, DQL1); the first clock transmission path (CLKLL0) having a first path length that transfers the internal clock signal (RLCLK) from the internal clock generating circuit (70) to the first output circuit (DQL0), the first clock transmission path (CLKLL0) including the first delay part (RL0) that delays the internal clock signal (RLCLK) for a first delay time interval; the second clock transmission path (CLKLL1) having a second path length that transfers the internal clock signal (RLCLK) from the internal clock generating circuit (70) to the second output circuit (DQL1), the second clock transmission path (CLKLL1) including the second delay part (RL1) that delays the internal clock signal (RLCLK) for a second delay time interval, wherein the first path length and the second path length are different from each other, and the first delay time interval and the second delay time interval are different from each other.

On the other hand, the eighth lower side clock line CLKLL7 is different from the first and the second lower side clock lines CLKLL0, CLKLL1 in a way where the eighth lower side clock line CLKLL7 includes no resistor element. The eighth lower side clock wire CLKLL7 includes a line portion CLKLL7_1 formed as the fourth wiring layer L4 in FIG. 7 and a line portion CLKLL7_2 formed as the second wiring layer L2 in FIG. 7.

Modified Example

Figure 9:
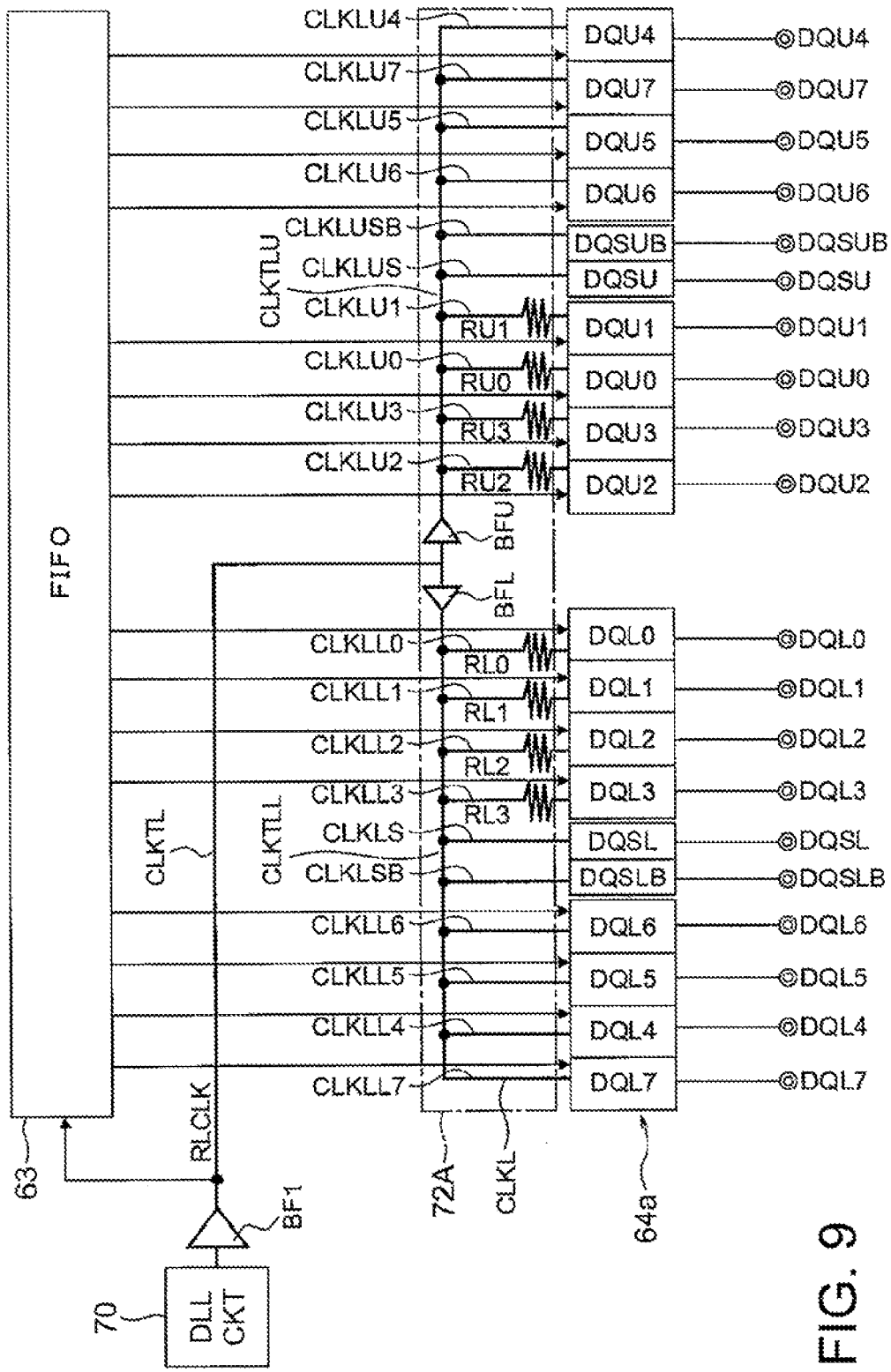
FIG. 9 is a circuit diagram showing a circuitry configuration of a clock tree according to a modified example of the first embodiment of the present invention.

FIG. 9 is a circuit diagram showing a circuitry configuration of a clock tree 72A according to a modified embodiment of a first embodiment.

It is considered, as a prototype, a case where resistor elements are not inserted in all of the clock lines. Under the circumstances, the internal clock signal RLCLK is early transferred, than the data strobe signal output portions, to the data output portions which are disposed in close vicinity to the lower side buffer circuit BFL and the upper side buffer circuit BFU than the data strobe signal output portions. In addition, the internal clock signal RLCLK is late transferred, than the data strobe signal output portions, to the data output portions which are disposed farther from the lower side buffer circuit BFL and the upper side buffer circuit BFU than the data strobe signal output portions. As a result, the plurality of read data outputted at the timings faster than the data strobe signal and the plurality of read data outputted at the timings slower than the data strobe signal are intermixed.

A control device such as the memory controller connected to the semiconductor device is configured to delay the data strobe signal outputted from the semiconductor device at the predetermined time interval and to fetch a plurality of read data outputted from the semiconductor device in synchronism with the data strove signal. As a result, there is in danger of a malfunction to fetch data in the control device if the plurality of read data outputted at the early timings than the data strobe signal and the plurality of read data outputted at the late timings than the data strobe signal are intermixed in the manner as the prototype.

By using the clock tree 72 of a first embodiment illustrated in FIG. 5, it is possible to substantially make phases of all items of read data in consonance with a phase of the data strobe signal, and then the problem of the above-mentioned prototype is resolved. However, there is a case where it is difficult to insert the resistor elements in all of the clock lines except that the lower side clock line CLKLL7 and the upper side clock line CLKLU4 due to area constraints of the regions to which the clock tree 72 is disposed or the like. Therefore, this modified embodiment is for the purpose of resolving the problem of the above-mentioned prototype even such a case.

Specifically speaking, in contradistinction to the clock tree 72 illustrated in FIG. 5, the clock tree 72A is different in respect where the resistor elements are not inserted in the lower side clock lines CLKLL4 to CLKLL4, CLKLS, and CLKLSB and the upper side clock lines CLKLU5 to CLLLU7, CLKLUS, and CLKLUSB. Inasmuch as the resistor elements are inserted in the clock lines corresponding to the data output portions alone that are disposed in close vicinity to the lower side buffer circuit BFL and the upper side buffer circuit BFU than the data strobe signal output portions, it is possible to synchronize output timings of all items of the read data to a timing later than that of the data strove signal, and therefore the problem of the above-mentioned prototype is resolved.

Second Embodiment

Figure 10:
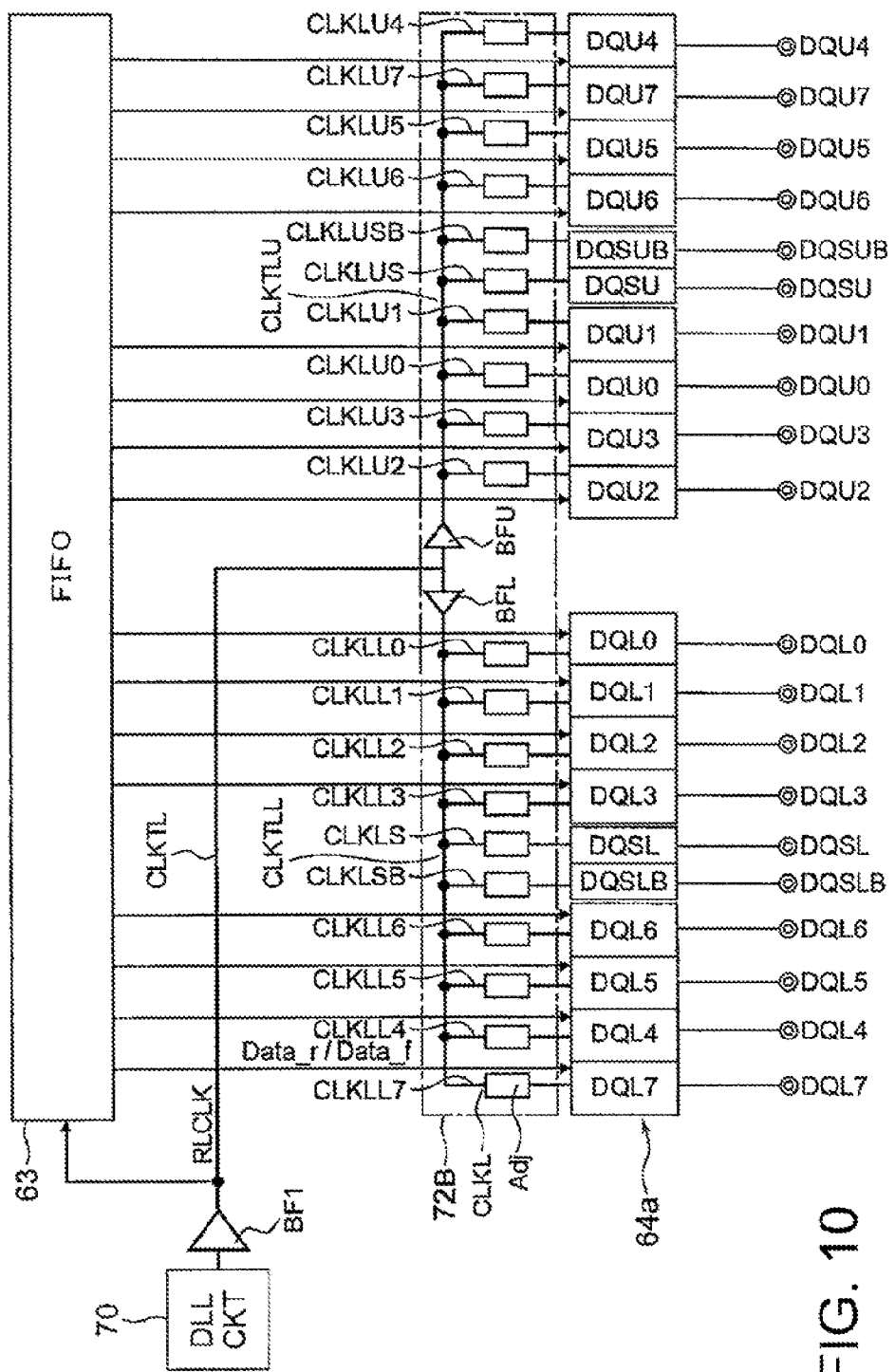
FIG. 10 is a circuit diagram showing a circuitry configuration of a clock tree according to a second embodiment of the present invention.

FIG. 10 is a circuit diagram showing a circuitry configuration of a clock tree 72B of a second embodiment of the present invention.

The illustrated clock tree 72B comprises a clock tree in which twenty resistor adjustable portions Adj are inserted in the respective clock lines instead of the resistor elements used in the clock tree 72 illustrated in FIG. 5.

Each of the resistor adjustable portions Adj is supplied with a plurality of corresponding fuse signals.

Figure 11:
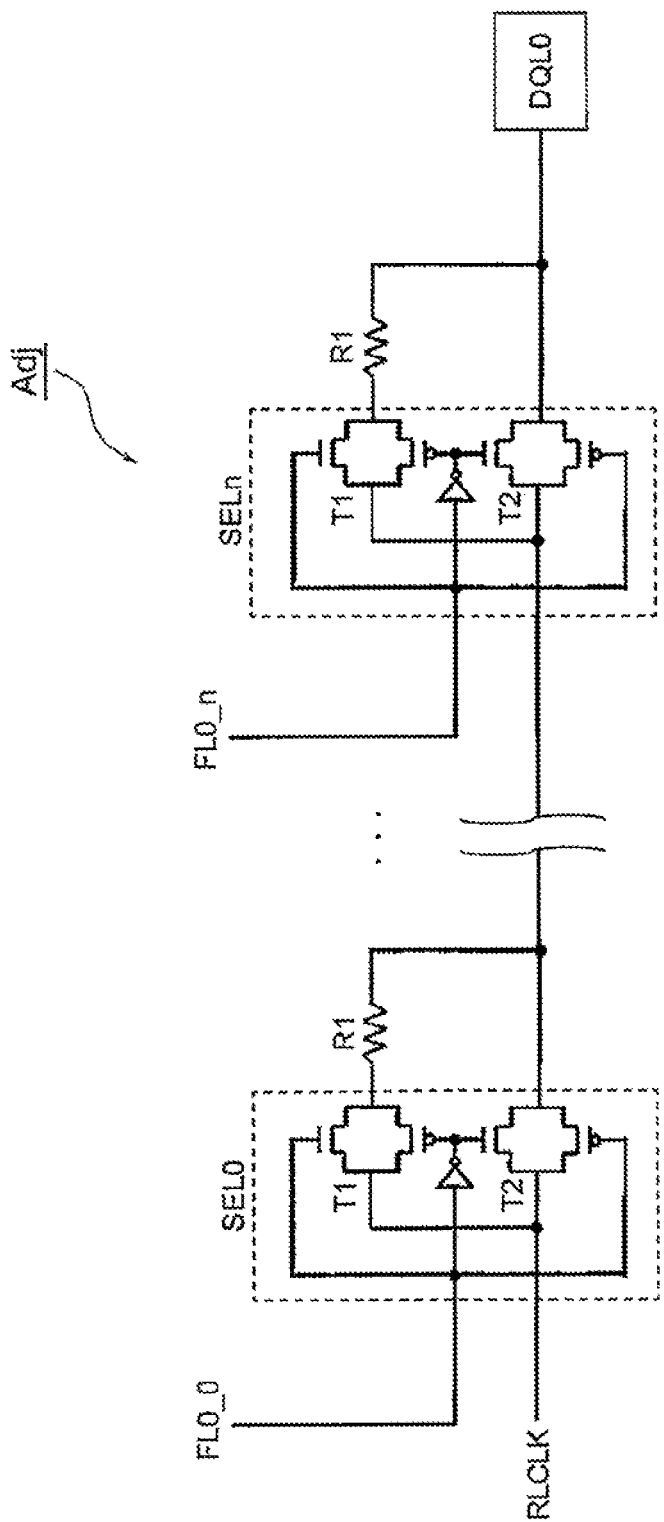
FIG. 11 is a circuit diagram showing a configuration of the resistor adjusting portion used in the clock tree illustrated in FIG. 10.

FIG. 11 is a circuit diagram showing a configuration of the resistor adjustable portion Adj of FIG. 10.

The resistor adjustable portion Adj comprises a plurality of resistor elements R1 and a plurality of selection circuits SEL0 to SELn. That is, the resistor adjustable portion Adj has a configuration in which the plurality of resistor elements R1 are connected in cascade via the plurality of selection circuits SEL0 to SELn.

The plurality of resistor elements R1 has resistance values which are equal to one another.

Among n pieces of resistor elements R1, by using k pieces of resistor elements R1, it is adjusted whether or not the internal clock signal RCLK is delayed, where k is an integer between 0 and n, both inclusive.

Use/non-use of the resistor elements R1 is carried out in the selection circuits SEL0 to SELn by using the fuse signals FL0_0 to FL0_n.

Third Embodiment

Figure 12:
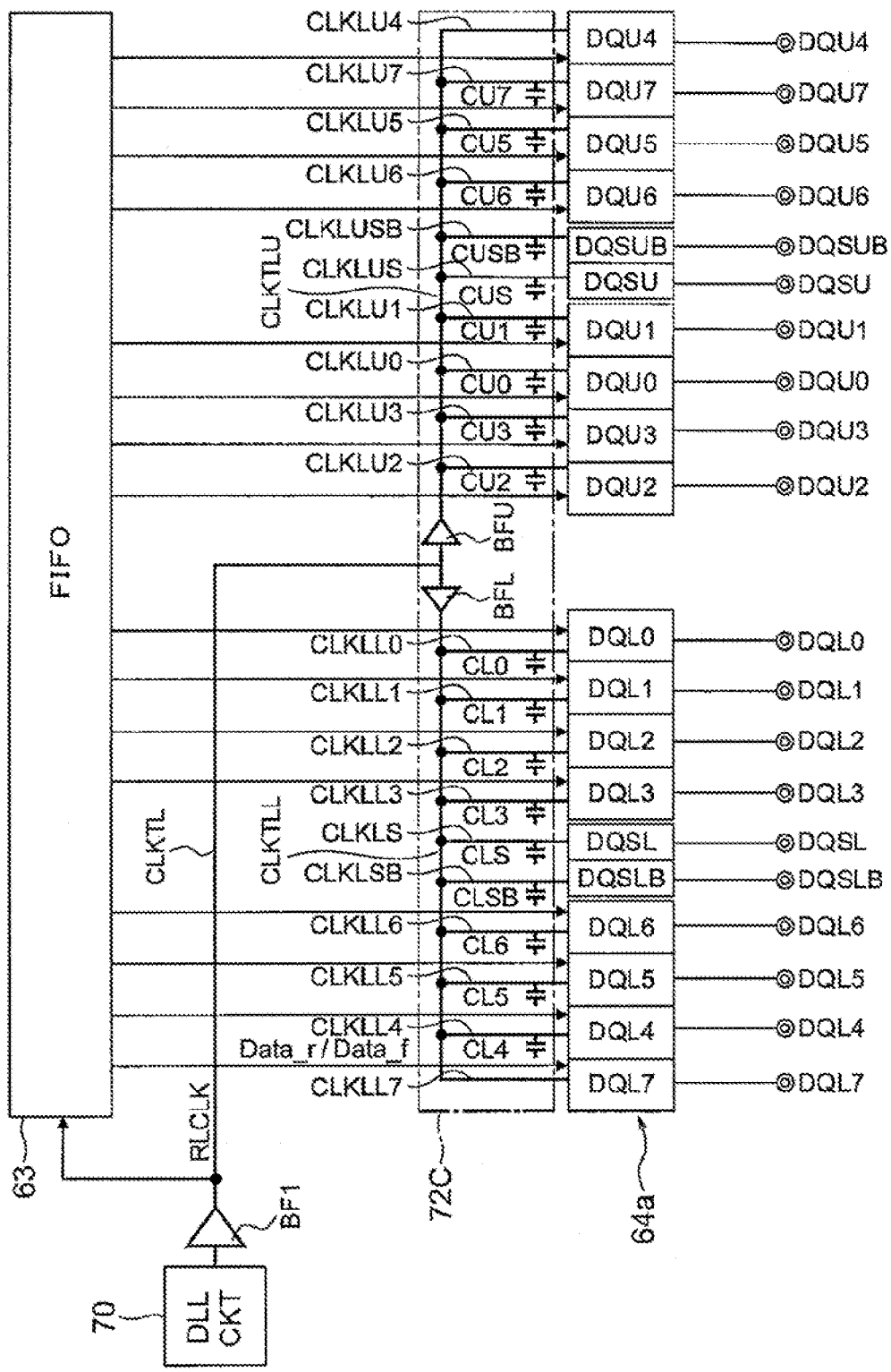
FIG. 12 is a circuit diagram showing a circuitry configuration of a clock tree according to a third embodiment of the present invention.

FIG. 12 is a circuit diagram showing a circuitry configuration of a clock tree 72C of a third embodiment of the present invention.

The illustrated clock tree 72C comprises a clock tree in which eighteen capacitor elements CL0 to CL6, CLSB, CLS, CU0 to CU3, CU5 to CU7, CUSB, and CUS are inserted in the clock lines in lieu of the eighteen resistor elements RL0 to RL6, RLSB, RLS, RU0 to RU3, RU5 to RU7, RUSB, and RUS used in the clock tree 72 illustrated in FIG. 5. That is, the clock tree 72C has a configuration in which the delay time intervals of the respective clock lines are adjusted by using the capacitor elements in place of the resistor elements.

The nine capacitor elements CL0 to CL6, CLSB, and CLS have capacitance values which are different from one another. Similarly, the nine capacitor elements CU0 to CU3, CU5 to CU7, CUSB, and CUS have capacitance values which are different from one another.

Incidentally, each capacitor element may be use, for example, a MOS (metal oxide semiconductor) capacitor.

Herein, in the lower side output portion, the DLL circuit 70 is also called an internal clock generation circuit, and a combination of the clock trunk line CLKTL, the lower side buffer circuit BFL, and the lower side clock trunk line CLKTLL is also called a clock trunk line (CLKTL, BFL, CLKTLL). In addition, the lower side clock line CLKLL0 is also called, for example, a first clock line while the lower side clock line CLKLL1 is also called, for example, a second clock line. In this event, the capacitor element CL0 is also called a first capacitor element, the capacitor element CRL1 is also called a second capacitor element, the lower side data output portion DQL0 is also called a first output circuit, and the lower side data output portion DQL1 is also called a second output circuit.

In that way, the semiconductor device (10) according to a third embodiment comprises the internal clock generation circuit (70), the buffer circuit (BF1) having an input terminal connected to the internal clock generation circuit (70), the first and the second output circuits (DQL0, DQL1), the clock trunk line (CLKTL, BFL, CLKTLL) having an end connected to an output node of the buffer circuit (BF1), the first clock line (CLKLL0) connecting the clock trunk line (CLKTL, BFL, CLKTLL) with the first output circuit (DQL0), and the second clock line (CLKLL1) connecting the clock trunk line (CLKTL, BFL, CLKTLL) with the second output circuit (DQL1), wherein the first clock line (CLKLL0) includes the first capacitor element (CL0) having the first capacitance value, the second clock line (CLKLL1) includes the second capacitor element (CL1) having the second capacitance value, the first capacitance value and the second capacitance value are different from each other.

This is one example, therefore, of course, other combinations may be.

On the other hand, in the lower side output portion, the DLL circuit 70 is also called the internal clock generation circuit, and a combination of the clock trunk line CLKTL, the upper side buffer circuit BFU, and the upper side clock trunk line CLKTLU is also called a clock trunk line (CLKTL, BFU, CLKTLU). In addition, the upper side clock line CLKLU2 is also called, for example, a first clock line while the upper side clock wire CLKLU3 is also called, for example, a second clock line. In this event, the capacitor element CU2 is also called a first capacitor element, the capacitor element CU3 is also called a second capacitor element, the upper side data output portion DQU2 is also called the first output circuit, and the upper side data output portion DQU3 is also called the second output circuit.

In that way, the semiconductor device (10) according to a third embodiment comprises the internal clock generation circuit (70), the buffer circuit (BF1) having an input terminal connected to the internal clock generation circuit (70), the first and the second output circuits (DQU2, DQU3), the clock trunk line (CLKTL, BFU, CLKTLU) having an end connected to an output node of the buffer circuit (BF1), the first clock line (CLKLU2) connecting the clock trunk line (CLKTL, BFU. CLKTLU) with the first output circuit (DQU2), and the second clock line (CLKLU3) connecting the clock trunk line (CLKTL, BFU, CLKTLU) with the second output circuit (DQU3), wherein the first clock line (CLKLU2) includes the first capacitor element (CU2) having the first capacitance value, the second clock line (CLKLU3) includes the second capacitor element (CU3) having the second capacitor value, the first capacitance value and the second capacitance value are different from each other.

This is one example, therefore, of course, other combinations may be.

While the invention has been particularly shown and described with reference to embodiments thereof, the invention is not limited to these embodiments. It will be understood by those of ordinary skill in the art that various changes in form and details may be made therein without departing from the sprit and scope of the present invention as defined the claims. For example, although a single resistor element (a single resistor adjustable portion) or a single capacitor element is used as the delay portion in the above-mentioned exemplary embodiments, as a matter of course, a combination of the resistor element and the capacitor element or a combination other than this may be used as the delay portion.

What is claimed is:

1. An apparatus comprising:
a clock terminal configured to receive an external clock signal;
a clock generator coupled to the clock terminal and configured to generate an internal clock signal in response to the external clock signal;
a main clock line coupled to the clock generator at a first portion, the main clock line further includes a second portion and a third portion that is between the first and second portion;
first and second output circuits arranged along the main clock line;
a first clock line coupled to the third portion of the main clock line at one end thereof and coupled to the first output circuit at the other end thereof; and
a second clock line coupled to the second portion of the main clock line at one end thereof and coupled to the second output circuit at the other end thereof, the first clock line is greater in length than the second clock line and the capacitance-resistance (CR) time constants of the first and second clock lines are substantially equal.

2. The apparatus as claimed in claim 1, wherein the main clock line elongates straightly in line.

3. The apparatus as claimed in claim 1, wherein the clock generator includes a DLL circuit.

4. An apparatus comprising:
a clock terminal configured to receive an external clock signal;
a clock generator coupled to the clock terminal and configured to generate an internal clock signal in response to the external clock signal;
a main clock line coupled to the clock generator at a first portion, the main clock line further includes a second portion and a third portion that is between the first and second portion;
first and second output circuits arranged along the main clock line;
a first clock line coupled to the third portion of the main clock line at one end thereof and coupled to the first output circuit at the other end thereof; and
a second clock line coupled to the second portion of the main clock line at one end thereof and coupled to the second output circuit at the other end thereof, the first clock line is greater in length than the second clock line, wherein the first clock line includes a first resistor and the second clock line includes a second resistor that is smaller in resistance value than the first resistor.

5. An apparatus comprising:
a clock terminal configured to receive an external clock signal;
a clock generator coupled to the clock terminal and configured to generate an internal clock signal in response to the external clock signal;
a main clock line coupled to the clock generator at a first portion, the main clock line further includes a second portion and a third portion that is between the first and second portion;
first and second output circuits arranged along the main clock line;
a first clock line coupled to the third portion of the main clock line at one end thereof and coupled to the first output circuit at the other end thereof; and
a second clock line coupled to the second portion of the main clock line at one end thereof and coupled to the second output circuit at the other end thereof, the first clock line is greater in length than the second clock line, wherein each of the first and second clock lines includes an adjustable resistor.

6. An apparatus comprising:
a clock terminal configured to receive an external clock signal;
a clock generator coupled to the clock terminal and configured to generate an internal clock signal in response to the external clock signal;
a main clock line coupled to the clock generator at a first portion, the main clock line further includes a second portion and a third portion that is between the first and second portion;
first and second output circuits arranged along the main clock line;
a first clock line coupled to the third portion of the main clock line at one end thereof and coupled to the first output circuit at the other end thereof; and
a second clock line coupled to the second portion of the main clock line at one end thereof and coupled to the second output circuit at the other end thereof, the first clock line is greater in length than the second clock line, wherein the first clock line includes a first capacitor and the second clock line includes a second capacitor that is smaller in capacitance value than the first capacitor.

7. An apparatus comprising:
a clock terminal configured to receive an external clock signal;
a clock generator coupled to the clock terminal and configured to generate an internal clock signal in response to the external clock signal;
a main clock line coupled to the clock generator at a first portion, the main clock line further includes a second portion and a third portion that is between the first and second portion;
first and second output circuits arranged along the main clock line;
a first clock line coupled to the third portion of the main clock line at one end thereof and coupled to the first output circuit at the other end thereof;
a second clock line coupled to the second portion of the main clock line at one end thereof and coupled to the second output circuit at the other end thereof, the first clock line is greater in length than the second clock line; and
a multi-level wiring structure including a first wiring layer, a second wiring layer formed above the first wiring layer and a third wiring layer formed above the second wiring layer, and wherein the main clock line is formed as the third wiring layer, each of the first and second clock lines includes a first line portion that is formed as the first wiring layer, a second line portion that is formed as the second wiring layer and a third line portion that is formed as the third wiring layer.

8. The apparatus as claimed in claim 7, wherein the second line portion of the first clock line is coupled to the first output circuit, the third line portion of the first clock line is coupled to the main clock line, the first line portion of the first clock line is coupled between the second and third line portions of the first clock line, the third line portion of the second clock line is coupled to the main clock line, the second line portion of the second clock line is coupled to the second output circuit, and the first line portion of the second clock line is coupled between the second and third line portions of the second clock line.

9. The apparatus as claimed in claim 7, wherein the first line portion of the first clock line is greater in length than the first line portion of the second clock line.

10. The apparatus as claimed in claim 7, wherein the first wiring layer includes a tungsten layer.

11. An apparatus comprising:
a clock terminal configured to receive an external clock signal;
a clock generator coupled to the clock terminal and configured to generate an internal clock signal in response to the external clock signal;
first and second output circuits each coupled to the clock generator;
a first clock line coupled to the clock generator at one end thereof and coupled to the first output circuit at the other end thereof to convey the internal clock signal from the clock generator to the first output circuit, the first clock line representing a first capacitance and a first resistance; and
a second clock line coupled to the clock generator at one end thereof and coupled to the second output circuit at the other end thereof to convey the internal clock signal from the clock generator to the second output circuit, the second clock line representing a second capacitance that is different from the first capacitance and a second resistance that is different from the first resistance,
wherein a first value defined as the product of the first capacitance and the first resistance is substantially equal to a second value defined as the product of the second capacitance and the second resistance.

12. The apparatus as claimed in claim 11, wherein the first clock line is different in length from the second clock line.

13. The apparatus as claimed in claim 11, wherein the first clock line includes a first resistor, the second clock line includes a second resistor and the first resistor is different in resistance from the second resistor.

14. The apparatus as claimed in claim 13, further comprising a semiconductor substrate and a first wiring layer located above the semiconductor substrate, and wherein each of the first and second resistors is formed as the first wiring layer.

15. The apparatus as claimed in claim 11, wherein the first clock line includes a first part, the second clock line includes a second part, and the first part of the first clock line and the second part of the second clock line are formed as a common clock line.

16. The apparatus as claimed in claim 15, further comprising a multi-level wiring structure including a first wiring layer and a second wiring layer formed above the first wiring layer, and wherein the common clock line is formed as the second wiring layer, the first clock line includes a first resistor, the second clock line includes a second resistor that is different in resistance from the first resistor, and each of the first and second resistors is formed as the first wiring layer.

17. The apparatus as claimed in claim 11, wherein each of the first and second clock lines includes an adjustable resistor.

18. The apparatus as claimed in claim 11, wherein the first clock line includes a first capacitor, the second clock line includes a second capacitor and the first capacitor is different in capacitance from the second capacitor.

19. The apparatus as claimed in claim 11, further comprising a memory cell array, and wherein each of the first and second output circuits includes a multiplexer circuit coupled to the memory cell array and operates in response to the internal clock signal.

20. The apparatus as claimed in claim 11, wherein the clock generator includes DLL circuit.

\* \* \* \* \*